United States Patent
Lee

(10) Patent No.: US 7,608,505 B2
(45) Date of Patent: Oct. 27, 2009

(54) METHOD OF MANUFACTURING NON-VOLATILE MEMORY DEVICE

(75) Inventor: Yong Jun Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 481 days.

(21) Appl. No.: 11/643,880

(22) Filed: Dec. 22, 2006

(65) Prior Publication Data

US 2007/0148868 A1    Jun. 28, 2007

(30) Foreign Application Priority Data

Dec. 28, 2005  (KR) .................. 10-2005-0132752

(51) Int. Cl.
*H01L 21/8247* (2006.01)

(52) U.S. Cl. .................. 438/257; 257/E21.679

(58) Field of Classification Search ............... 438/257; 257/E21.679, E21.663, E21.209, E27.104
See application file for complete search history.

(56) References Cited

U.S. PATENT DOCUMENTS

| | | | |
|---|---|---|---|
| 6,703,298 B2 * | 3/2004 | Roizin et al. .............. 438/593 |
| 6,706,592 B2 * | 3/2004 | Chern et al. ............... 438/257 |
| 6,730,565 B2 * | 5/2004 | Cho et al. .................. 438/266 |
| 6,803,276 B2 * | 10/2004 | Kim et al. .................. 438/257 |
| 7,190,021 B2 * | 3/2007 | Kang ......................... 257/316 |
| 7,238,959 B2 * | 7/2007 | Chen .............................. 257/2 |
| 2002/0025631 A1 * | 2/2002 | Bez et al. ................... 438/257 |
| 2002/0119615 A1 * | 8/2002 | Kim et al. .................. 438/201 |
| 2004/0094794 A1 * | 5/2004 | Wu ............................. 257/316 |
| 2006/0008983 A1 * | 1/2006 | Yeh ............................. 438/257 |
| 2006/0102948 A1 * | 5/2006 | Chang et al. .............. 257/315 |
| 2007/0048993 A1 * | 3/2007 | Willer et al. ............... 438/597 |

* cited by examiner

*Primary Examiner*—Thao P. Le
(74) *Attorney, Agent, or Firm*—Lowe Hauptman Ham & Berner, LLP

(57) ABSTRACT

A method of manufacturing a non-volatile memory device includes the steps of: defining an active region on a semiconductor substrate; forming a charge storage layer on the active region; forming a first conductive pattern on the charge storage layer, wherein the first conductive pattern has a bottom portion larger in width than a top portion thereof, the first conductive pattern further having a sloping sidewall connecting the top and bottom portions; forming an oxide layer on the sidewall of the first conductive pattern; forming a conformal second conductive layer on the first conductive pattern and on the active region around the first conductive pattern; and patterning the first conductive pattern and the second conductive layer to form a pair of first electrodes and a pair of second electrodes, respectively.

14 Claims, 5 Drawing Sheets

_US 7,608,505 B2_

METHOD OF MANUFACTURING NON-VOLATILE MEMORY DEVICE

TECHNICAL FIELD

The disclosure relates to a manufacturing technology of a semiconductor device; and, more particularly, to a method of manufacturing a non-volatile memory device, such as a split-gate type non-volatile memory device.

BACKGROUND

Since a non-volatile memory device is capable of erasing or storing data electrically and allows data to be conserved without supplying power thereto, applications of the non-volatile memory device tend to increase in various fields. Such the non-volatile memory device is representatively classified into a NAND type and a NOR type. The NAND type is mainly used for storing data, whereas the NOR type is mainly used for booting an electric device such as a computer.

Meanwhile, the NOR type non-volatile memory device connects a plurality of memory cells composed of one transistor to one bit line in parallel and formed of a structure that only one memory cell transistor is connected between a drain coupled to the bit line and a source region coupled to a common source line. The NOR type non-volatile memory device has advantages that a current is high in the memory cell has a high current and is capable of being operated at a high speed, whereas it has a shortcoming that a high integration is difficult since a contact of the bit line and the common source line occupy large spaces.

In the NOR type non-volatile memory device, since a plurality of memory cells is connected to a bit line in parallel, if a threshold voltage of a memory cell transistor becomes lower than a voltage, e.g., 0V, applied to a word line of a non-selected memory cell, there occurs an erroneous operation that all memory cells are read as an on-state by flowing the current between the source and the drain regardless of the on/off states of the selected memory cell. In order to overcome such problems, a non-volatile memory device having a structure generally referred to as a split-gate type has been introduced.

Meanwhile, a non-volatile memory device can be classified into a flash memory device having a stacked gate structure of a floating gate tunnel oxide (FLOTOX) structure and a silicon-oxide-nitride-oxide-silicon (SONOS) device has a structure similar to the MOS transistor and is provided with a multi-layered gate insulating layer. A gate insulating layer of the SONOS device generally has a structure(ONO layer: Oxide-Nitride-Oxide) obtained by sequentially stacking a silicon oxide layer, a silicon nitride layer and a silicon oxide layer as a plurality of insulating layers for storing charges; and, since the charges are stored at a deep level trap of the nitride layer, the non-volatile memory device has an excellent property in reliability in comparison with the flash memory device and allows a writing operation and an erasing operation at a low voltage.

FIG. 1a to FIG. 1c are cross-section views showing a method of manufacturing a conventional split-gate type non-volatile memory device. FIG. 1a to FIG. 1c show cross-sectional views vertical to a word line.

Referring to FIG. 1a, an active region 11 is defined by forming a device isolation layer(not shown) on a semiconductor substrate 10 in parallel to a direction of a bit line. And, a multi-layer of a charge storage layer 14, a first conductive layer 16 and a capping layer 18 and 20 are formed on the semiconductor substrate 10 with a predetermined width in parallel with the word line. Herein, an ONO layer can be utilized as the charge storage layer 14 and the capping layers 18 and 20 can be obtained by stacking the silicon oxide layer 18 functioning as a buffer and a silicon nitride layer 20 used as a hard mask. Thereafter, a sidewall insulating layer 22 is formed by performing an oxidation process to a sidewall of the first conductive layer 16 in order to cure the sidewall damaged during a process of forming the first conductive pattern 16.

Sequentially, after a portion of the multi-layer charge storage layer exposed on an active region 11 is removed except the multi-layer charge storage layer 14 below the first conductive pattern 16, a gate insulating layer 24 is formed on an active region of the exposed substrate.

In the next step, referring to FIG. 1b, a second conductive layer 26 is conformally formed on the gate insulating layer 24 and the first conductive pattern 16. Thereafter, a photoresist pattern 28 having an opening 27 is formed on the second conductive layer 26. The photoresist pattern 28 is formed such that the opening 27 defines a top of the active region 11 as well as the first conductive pattern 16. A portion of the second conductive layer 26 is exposed by the opening 27.

Referring to FIG. 1c, by using the photoresist pattern 28 as an etching mask, various layers, e.g., the capping layer, the first conductive layer and the ONO layer, below the second conductive layer 26 as well as the second conductive layer 26 are etched at the same time. Therefore, a pair of split-gates are formed on the active region 11 of the substrate, wherein the split-gates include the ONO layer 14, the first electrode 16a and the capping layer patterns 18a and 20a from a bottom and the second electrode 26a extending to the sidewall of the first electrode from a top of the capping layer patterns. The pair of the split-gates form the word line in a direction vertical to the bit line.

Meanwhile, FIG. 2a shows a top view of a substrate formed thereon a pair of first electrodes 16a and a pair of second electrodes 26a, and FIG. 2b shows a vertical cross-sectional view of a split gate at an end portion of a word line.

Referring to FIG. 2a and FIG. 2b, the pair of first electrodes 16a and the pair of second electrode 26a formed through the etching process of FIG. 1c are arranged to face each other; and, by exposing a common source(or a drain) region A between the pair of first electrodes 16a and the pair of second electrode 26a, a common line is formed in order to connect each of the memory cells to the exposed common source region A in parallel. In the conventional method, as shown in FIG. 1a, in order to form the first conductive pattern 16, the poly silicon layer and the capping layers are sequentially formed on a previously formed charge storage layer 14 and the first conductive pattern 16 parallel to the word line is formed by patterning the poly silicon layer and the capping layer simultaneously. And, the sidewall oxide layer 22 is formed by oxidizing the sidewall of the formed first conductive pattern 16. At this time, the formed sidewall oxide layer 22a has a shape that a central portion thereof is further thicker than both top and bottom end portions thereof by a smiling phenomenon.

Therefore, as shown in FIG. 1c, in case when the first conductive layer and the second conductive layer are patterned at the same time, byproducts such as polymers formed during the etching process remain at a region B of a lower portion, i.e., a portion of the second conductive layer around one end portion of the word line, of the smiling type sidewall oxidation layer B, thereby generating a conductive stringer R. Through an image of the scanning electron microscope (SEM) shown in FIG. 3, it is possible to identify that the conductive stringer remains at one end portion of the word line. As shown in FIG. 2a, the conductive stringer F formed like this causes a short between the pair of second electrodes 26a facing each other, thereby deteriorating a performance of the device.

SUMMARY

Therefore, there is a need to provide a method of manufacturing a split-gate type non-volatile memory device capable of improving reliability of a device by improving a profile of a first conductive pattern used as a control gate.

In accordance with an embodiment of the present invention, there is provided a method of manufacturing a non-volatile memory device, the method including the steps of: defining an active region on a semiconductor substrate; forming a charge storage layer on the active region; forming a first conductive pattern on the charge storage layer, wherein the first conductive pattern has a bottom portion larger in width than a top portion thereof, the first conductive pattern further having a sloping sidewall connecting the top and bottom portions; forming an oxide layer on the sidewall of the first conductive pattern; forming a conformal second conductive layer on the first conductive pattern and on the active region around the first conductive pattern; and patterning the first conductive pattern and the second conductive layer to form a pair of first electrodes and a pair of second electrodes, respectively.

The first conductive pattern can be formed by various methods. For example, the first conductive pattern may be formed by forming a fist conductive layer on the charge storage layer; and then patterning the first conductive layer.

A capping insulating layer can be further formed on a top of the first conductive layer; in this case, the formed capping insulating layer is patterned together with the first conductive layer at the same time and it is preferable that a high temperature oxidation is utilized for forming the sidewall oxide layer of the first conductive pattern; and it is further preferable that the sidewall oxide layer formed like this is formed with a dense structure by annealing the sidewall oxidation layer.

BRIEF DESCRIPTION OF THE DRAWINGS

The above and other objects and features of the present invention will become apparent from the following description of several embodiments given in conjunction with the accompanying drawings, in which.

DETAILED DESCRIPTION OF EMBODIMENTS

Hereinafter, several embodiments of the present invention will be described in detail with reference to the accompanying drawings so that they can be readily implemented by those skilled in the art.

Figure 4:
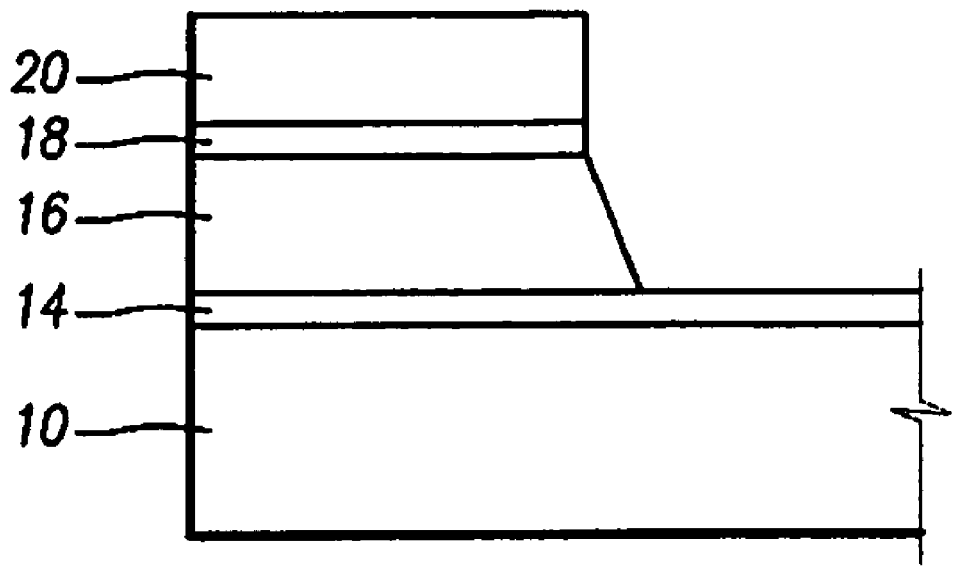
FIGS. 4 to 6 are cross-section views illustrating a method of manufacturing a split-gate type non-volatile memory device in accordance with one embodiment of the present invention.
Figure 5:
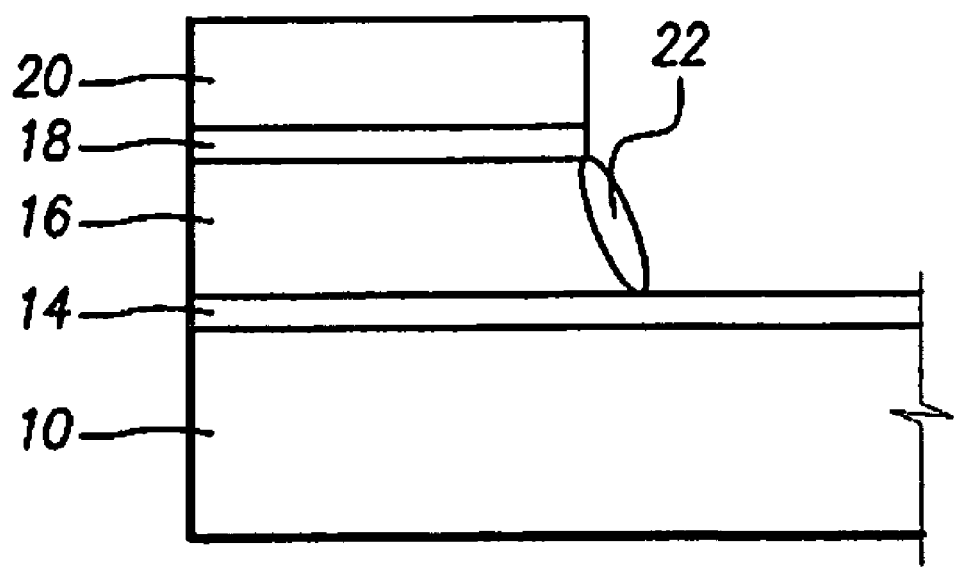

FIGS. 4 and 5 illustrate cross-section views vertical to a bit line at one end portion of a word line.

First, referring to FIG. 4, a charge storage layer 14 is formed on an active region of a semiconductor substrate 10 and a first conductive layer is formed on the charge storage layer 14 with a poly silicon layer. A buffer oxide layer and a nitride layer for a hard mask can be further stacked on the first conductive layer. As shown in FIG. 4, a first conductive pattern 16 and a pair of capping layer patterns 18 and 20 are formed by sequentially etching the stacked nitride layer, the oxide layer and the first conductive layer. Especially, the first conductive pattern 16 formed like this extends in parallel to a word line with forming its width wide and the first conductive pattern 16 is formed into a pair of first electrodes by being patterned again in a following process.

In an etching process for forming the first conductive pattern 16, the first conductive pattern 16 is formed to have a positive slope by controlling a process parameter, especially a reaction gas. That is, the first conductive pattern 16 is formed in such a way that a width of a low portion thereof is wider than that of a top portion thereof.

Thereafter, as shown in FIG. 5, after the first conductive pattern 16 is formed, a sidewall oxide layer 22 is formed on a sidewall of the first conductive pattern 16 by using an oxidation process. At this time, since the sidewall of the first conductive pattern 16 is obliquely formed, although the sidewall oxide layer 22 formed through an oxidation process has a smiling shape, the sidewall oxidation layer 22 does not act as a mask when the first conductive pattern 16 and a second conductive layer are etched. Therefore, a conductive stringer does not remain at a bottom of the sidewall oxidation layer 22.

And also, in order to minimize a smiling phenomenon of the sidewall oxide layer 22, it is preferable that the oxidation process of the first conductive pattern 16 is performed through a high temperature oxidation. In this case, since the poly silicon used as the first conductive pattern 16 is rapidly oxidized, the smiling phenomenon occurs scarcely. Merely, since the oxidation layer grown by the high temperature oxidation process has a sparse structure, there is a need of annealing the formed oxide layer in order to reinforce an insulating characteristic between the first electrode and the second electrode.

Figure 1A:
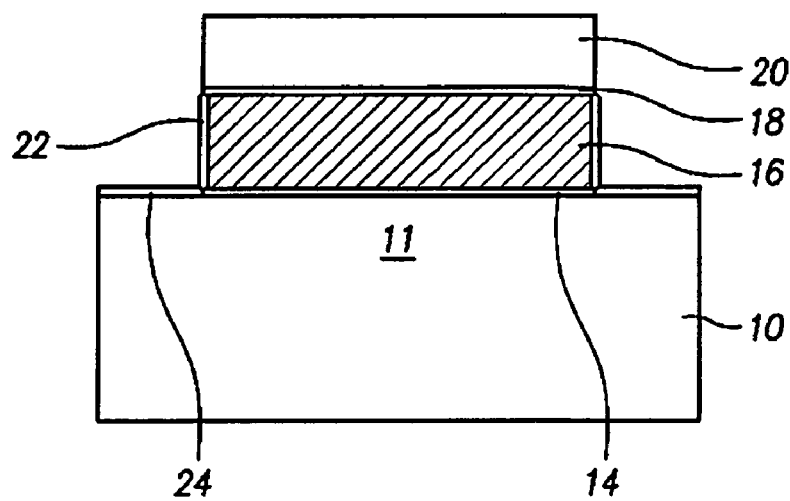
FIGS. 1a to 1c are cross-sectional views showing a method of manufacturing a conventional split-gate type non-volatile memory device.
Figure 1B:
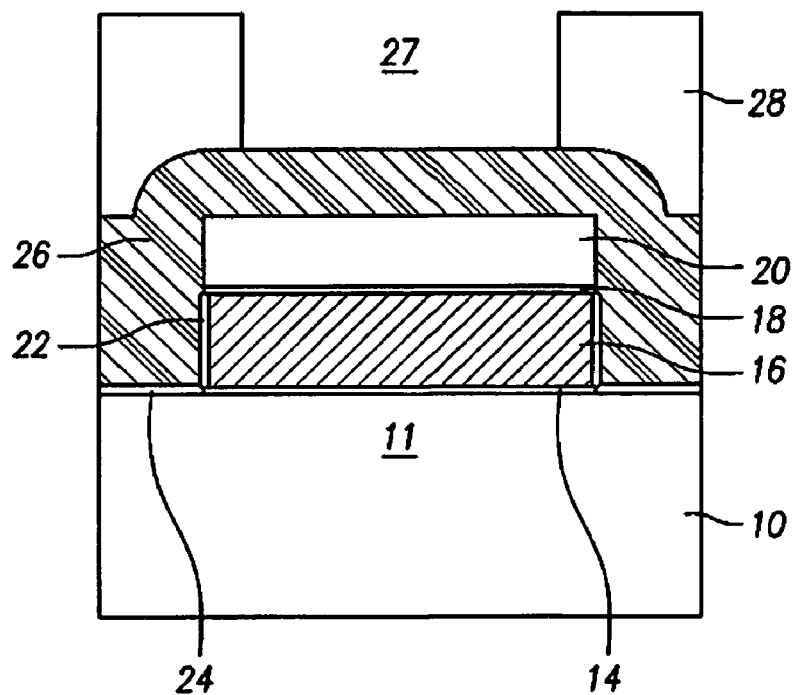
Figure 1C:
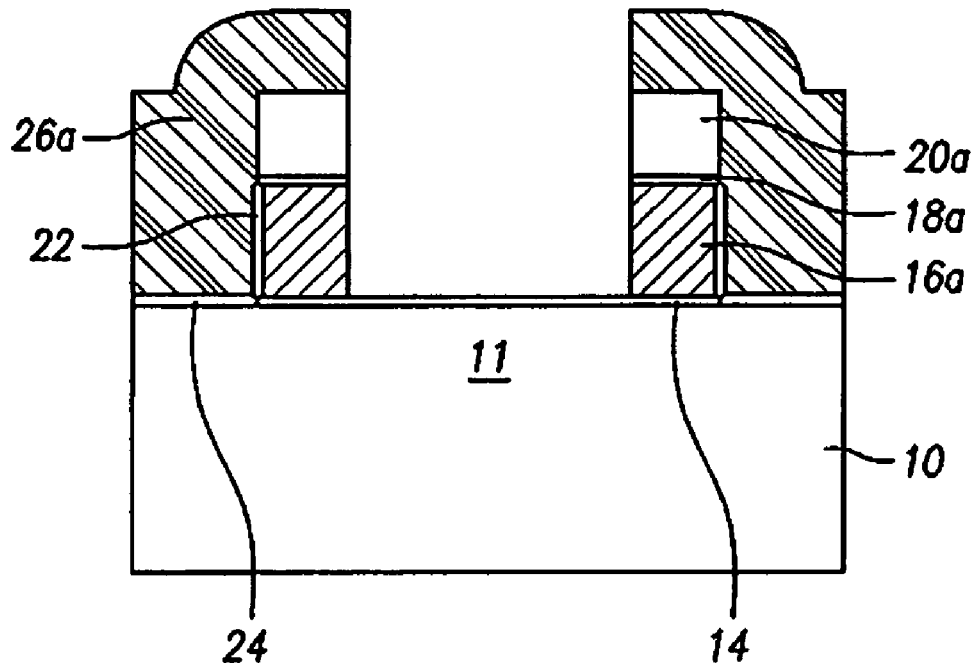
Figure 2A:
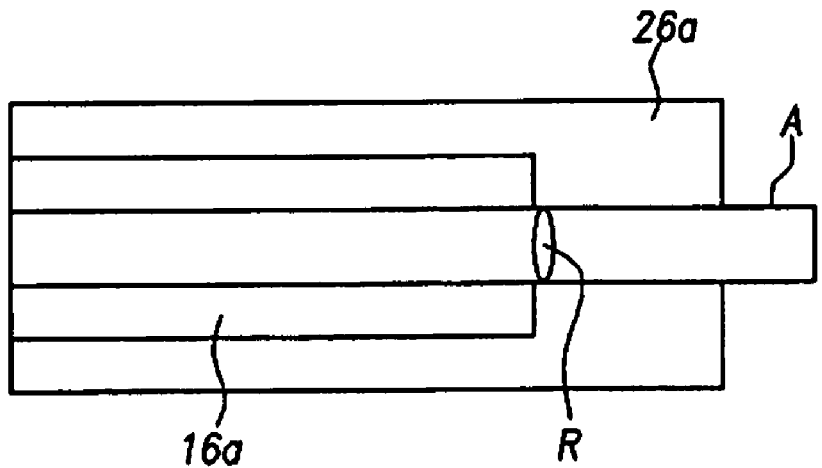
FIGS. 2a and 2b are diagrams describing a problem that a conductive stringer remains at a common line region when a split-gate of a symmetric structure is formed by a method of FIG. 1a to FIG. 1c.
Figure 2B:
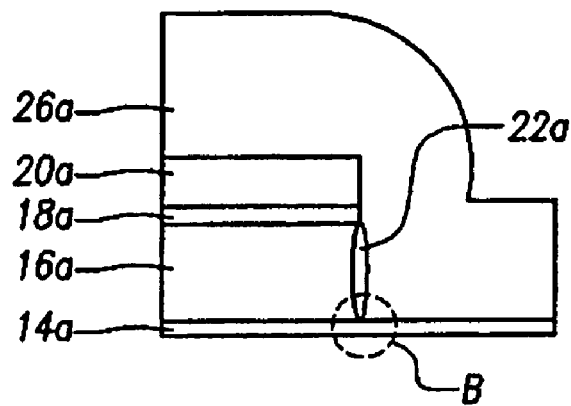
Figure 3:
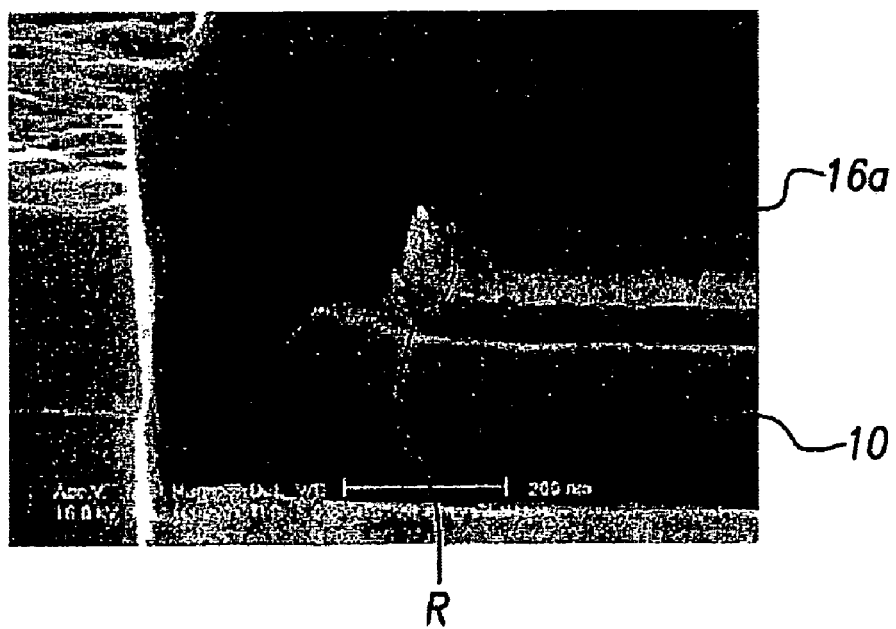
FIG. 3 is a photograph showing an image of a conductive stringer formed on one end of a control gate which is photographed by a scanning electron microscope.

After the oxide layer 22 is formed on the sidewall of the first conductive pattern 16, the charge storage layer 14 formed on a remaining region on which the first conductive pattern 16 is not formed is stripped and a gate oxide layer is formed on an active region of the substrate 10 exposed by stripping the charge storage layer 14. And, as shown in FIG. 1b and FIG. 1c, after the second conductive layer is conformally formed on the gate oxide layer and the first conductive pattern 16, a split-gate is formed by etching the second conductive layer and the first conductive pattern simultaneously to have a structure that a pair of first electrodes and a pair of second electrodes are symmetric to each other.

Figure 6:
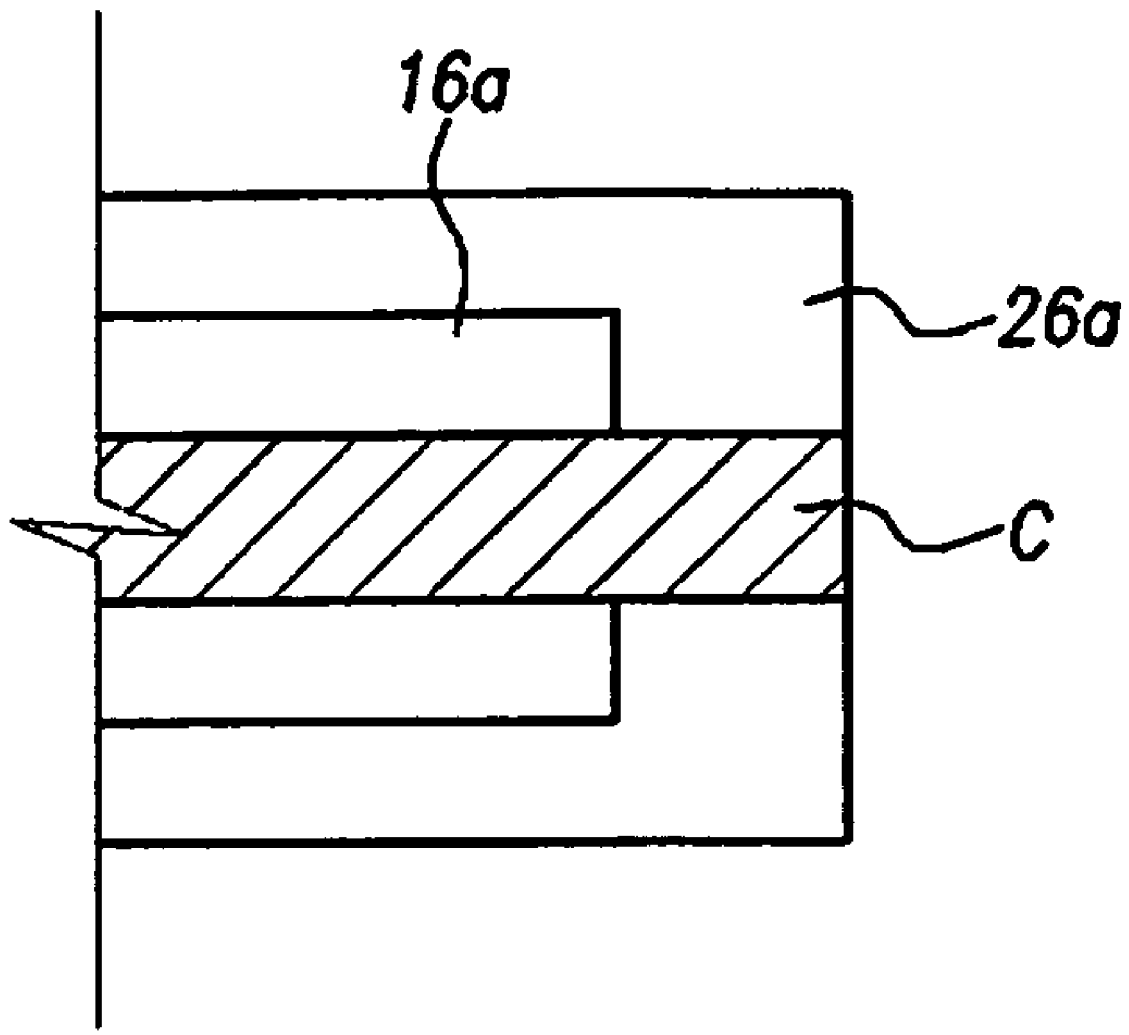

FIG. 6 shows a top surface of a substrate formed thereon a split-gate having a symmetric structure. As shown in FIG. 6, since a conductive stringer does not remain at a region C where a common line is formed, a short between a pair of second electrodes 26a does not occur. Therefore, program/erasing operations of a device can be smoothly performed.

In accordance with embodiments of the present invention, by improving a profile of a first conductive pattern, in a process of forming a split-gate having a symmetric structure, a phenomenon that a conductive stringer remains at a region where a common line is formed without etching a portion of the second conductive layer can be effectively prevented.

Therefore, it can improve reliability of a non-volatile memory device having a split-gate structure.

While the invention has been shown and described with respect to the disclosed embodiments, it will be understood by those skilled in the art that various changes and modifications may be made without departing from the spirit and scope of the invention as defined in the following claims.

What is claimed is:

1. A method of manufacturing a non-volatile memory device, the method comprising the steps of:
    defining an active region on a semiconductor substrate;
    forming a charge storage layer on the active region;
    forming a first conductive pattern on the charge storage layer, wherein the first conductive pattern has a bottom portion larger in width than a top portion thereof, the first conductive pattern further having a sloping sidewall connecting the top and bottom portions;
    forming an oxide layer on the sloping sidewall of the first conductive pattern;
    forming a conformal second conductive layer on the first conductive pattern and on the active region around the first conductive pattern; and
    patterning the first conductive pattern and the second conductive layer to form a pair of first electrodes and a pair of second electrodes, respectively.

2. The method of claim 1, wherein the step of forming the first conductive pattern includes:
    forming a first conductive layer on the charge storage layer; and
    patterning the first conductive layer to form the first conductive pattern.

3. The method of claim 2, further comprising:
    forming a capping insulating layer on a top of the first conductive layer;
    wherein the capping insulating layer and the first conductive layer are simultaneously patterned in the step of pattering the first conductive layer to form the first conductive pattern.

4. The method of claim 1, wherein the step of forming the oxide layer is performed by using a high temperature oxidation process.

5. The method of claim 4, further comprising:
    annealing the oxide layer formed by the high temperature oxidation process.

6. The method of claim 1, further comprising the steps of:
    removing a portion of the charge storage layer on which the first conductive pattern is not formed; and
    forming a gate insulating layer on the active region where the portion of the charge storage layer has been removed.

7. The method of claim 2, wherein the step of forming the oxide layer is performed by using a high temperature oxidation process.

8. The method of claim 7, further comprising:
    annealing the oxide layer formed by the high temperature oxidation process.

9. The method of claim 2, further comprising the steps of:
    removing a portion of the charge storage layer on which the first conductive pattern is not formed; and
    forming a gate insulating layer on the active region where the portion of the charge storage layer has been removed.

10. The method of claim 2, wherein the step of pattering the first conductive layer to form the first conductive pattern includes:
    etching the first conductive layer while controlling a process parameter to whereby form the sloping sidewall of the first conductive pattern.

11. The method of claim 10, wherein the process parameter being controlled is a reaction gas used during said etching.

12. The method of claim 1, wherein said oxide layer is formed such that it does not act as a mask in the step of patterning the first conductive pattern and the second conductive layer, thereby avoiding formation of a conductive stringer below said oxide layer when the first conductive pattern and the second conductive layer are patterned.

13. The method of claim 1, wherein said oxide layer is formed to be confined within a boundary of the bottom portion of the first conductive pattern such that said oxide layer does not act as a mask in the step of patterning the first conductive pattern and the second conductive layer, thereby avoiding formation of a conductive stringer below said oxide layer when the first conductive pattern and the second conductive layer are patterned.

14. The method of claim 1, wherein at least one of (i) an inclination of the sloping sidewall of the first conductive pattern and (ii) a thickness of said oxide layer is controlled so that the formed oxide layer is confined within a boundary of the bottom portion of the first conductive pattern, as a result of which said oxide layer does not act as a mask in the step of patterning the first conductive pattern and the second conductive layer, thereby avoiding formation of a conductive stringer below said oxide layer when the first conductive pattern and the second conductive layer are patterned.

* * * * *